US010269613B2

(12) United States Patent
Kato et al.

(10) Patent No.: US 10,269,613 B2
(45) Date of Patent: Apr. 23, 2019

(54) SUBSTRATE CONVEYING ROBOT AND METHOD OF OPERATING THE SAME

(71) Applicant: KAWASAKI JUKOGYO KABUSHIKI KAISHA, Kobe-shi, Hyogo (JP)

(72) Inventors: Isao Kato, Nishinomiya (JP); Iori Kurata, Kobe (JP); Masayuki Saito, Kobe (JP); Hirohiko Goto, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 15/517,985

(22) PCT Filed: Oct. 10, 2014

(86) PCT No.: PCT/JP2014/077170
§ 371 (c)(1),
(2) Date: Apr. 10, 2017

(87) PCT Pub. No.: WO2016/056119
PCT Pub. Date: Apr. 14, 2016

(65) Prior Publication Data
US 2017/0294335 A1 Oct. 12, 2017

(51) Int. Cl.
*H01L 21/687* (2006.01)
*B25J 9/04* (2006.01)
*H01L 21/677* (2006.01)

(52) U.S. Cl.
CPC ........ *H01L 21/68707* (2013.01); *B25J 9/043* (2013.01); *H01L 21/67742* (2013.01); *H01L 21/67766* (2013.01)

(58) Field of Classification Search
CPC ..................................................... E02F 9/043
See application file for complete search history.

(56) References Cited

U.S. PATENT DOCUMENTS 6,109,860 A * 8/2000 Ogawa ..................... B25J 9/042
414/744.5
10,099,377 B2 * 10/2018 Freeman .................. B25J 9/043
(Continued)

FOREIGN PATENT DOCUMENTS

JP H05-109866 A 4/1993
JP 11188670 A * 7/1999 .............. B25J 9/042
(Continued)

OTHER PUBLICATIONS

Jan. 13, 2015 International Search Report issued in International Patent Application No. PCT/JP2014/077170.
(Continued)

*Primary Examiner* — Gerald McClain
(74) *Attorney, Agent, or Firm* — Oliff PLC

(57) ABSTRACT

A substrate conveying robot has left and right arms having a common pivot axis line, an arm drive unit for driving the left and right arms, and a control unit for controlling the arm drive unit. A pulley ratio between a turning pulley, a first pulley, a second pulley, and a third pulley is set so that a moving locus of the substrate holding members when the first link member is rotated about the pivot axis line by the first drive portion so as to extend and contract the arm in a state that the turning pulley is fixed is substantially linear. Thereby, the moving locus of the substrate holding member when extending and contracting the arm can be substantially linear.

18 Claims, 11 Drawing Sheets

(56) References Cited

U.S. PATENT DOCUMENTS

| | | | |
|---|---|---|---|
| 2004/0216475 A1 | 11/2004 | Sasaki et al. | |
| 2012/0141235 A1 | 6/2012 | Krupyshev et al. | |
| 2012/0232690 A1* | 9/2012 | Gilchrist | B25J 9/042 700/228 |
| 2014/0099180 A1 | 4/2014 | Ando | |
| 2014/0348618 A1* | 11/2014 | Blank | B25J 9/043 414/217 |
| 2016/0236345 A1* | 8/2016 | Yoshino | B25J 9/06 |
| 2017/0368680 A1* | 12/2017 | Muthukamatchi | B25J 11/0095 |

FOREIGN PATENT DOCUMENTS

| | | |
|---|---|---|
| JP | 2000-072248 A | 3/2000 |
| JP | 2004-288719 A | 10/2004 |
| JP | 2006-049530 A | 2/2006 |
| JP | 2006-062046 A | 3/2006 |
| JP | 2013-544034 A | 12/2013 |
| JP | 2014-022598 A | 2/2014 |
| JP | 2014-073558 A | 4/2014 |
| WO | WO 2012/026293 A1 * | 3/2012 |

OTHER PUBLICATIONS

Jan. 13, 2015 Written Opinion issued in International Patent Application No. PCT/JP2014/077170.

* cited by examiner

SUBSTRATE CONVEYING ROBOT AND METHOD OF OPERATING THE SAME

TECHNICAL FIELD

The present invention relates to a substrate conveying robot comprising left and right arms having a common pivot axis line and a method for operating the same.

BACKGROUND ART

Conventionally, a substrate conveying robot with left and right arms is known as a substrate conveying robot for conveying a substrate such as a semiconductor wafer. Each arm of the substrate conveying robot has a first, link member rotatable about a pivot axis line, a second link member rotatably connected to a tip end portion of the first link member, and a substrate holding member (hand) rotatably connected to a tip end portion of the second link member.

For simplification of the robot structure or the like, one of the substrate conveying robots with the left and right arms is a substrate conveying robot in which a pivot axis line is shared the left and right arms (Patent Document 1). In the substrate conveying robot of this type, the first link member and the second link member are configured to be the same length, and also the left and right substrate holding members are arranged at different heights.

In contrast, when the pivot axis line is shared by the left and right arms and also the left and right substrate holding members are arranged at the same height in the substrate conveying robot, there is a problem that, when the first link member and the second link member are set to the same length, the second link members of the left and right arms interfere with each other or the second link member and the pivot axis line interfere with each other in changing the arms from their extended state to their contracted state.

In order to solve the problems of the interference between the second link members or the interference between the second link member and the pivot axis line, it is considered to set the length of the second link member shorter than the length of the first link member.

Note that, when the first link member and the second link member are set to the same length, a moving locus of the tip end portion of the second link can be linear by setting the rotational speed of the first link member about the pivot axis line and the rotational speed of the second link member about a first rotational axis line on the tip end portion of the first link member to 1:2.

Also, an attitude of the substrate holding member in the extension-contraction operation of the arms can be maintained constant so as to make a moving locus of the substrate holding member linear by setting the rotational speed of the second link member about the first rotational axis line and the rotational speed of the substrate holding member about a second rotational axis line on the tip end portion of the second link member to 2:1.

CITATION LIST

Patent Document

[Patent Document 1] Japanese Patent Application Laid-Open No. H05-109866

SUMMARY OF INVENTION

Objects to be Achieved by the Invention

In contrast, when the length of the second link member is set shorter than the length of the first link member in order to solve the problem of the interference between the second link members of the left and right arms or the problem of the interference between the second link member and the pivot axis, there is a problem that the moving locus of the tip end portion of the second link member in the extension-contraction operation of the arms is formed in a curved shape which is largely deviated from a straight line. Accordingly, maintaining the attitude of the substrate holding member constant becomes difficult, and therefore the moving locus of the substrate holding member is formed in a curved shape which is largely deviated from a straight line.

When linearity of the moving locus of the substrate holding member cannot be ensured sufficiently, positioning the substrate holding member in a target position becomes difficult. Particularly, when the first link member and the second link member and the substrate holding member are configured so as to interlock by the power transmitting mechanism composed of a pulley and a belt, it is difficult to adjust a position of the substrate holding member with sufficiently high flexibility in the front-back direction (X direction) and the left and right direction (Y direction).

The present invention is made considering the above-mentioned problems of the conventional art and its object is to form the moving locus of the substrate conveying member in the extension-contraction operation of the arms in the substrate conveying robot which comprises left and right arms having a common pivot axis line and has left and right substrate holding members arranged at the same height.

Also, an object of the present invention is to allow a position of the substrate holding member to be adjusted with sufficiently high flexibility in the front-back direction (X direction) and the left and right direction (Y direction) in the substrate conveying robot which comprises left and right arms having a common pivot axis line and has left and right substrate holding members arranged at the same height.

Means for Achieving the Objects

In order to achieve the above-mentioned objects, a substrate conveying robot according to a first aspect of the present invention comprises left and right arms having a common pivot axis line, an arm drive unit for driving the left and right arms, and a control unit for controlling the arm drive unit, wherein each of the left and right arms has a first link member having the pivot axis line in a base end portion and having a first rotational axis line on a tip end portion, a second link portion having the first rotational axis line in a base end portion and having a second rotational axis line on a tip end portion, and a substrate holding member configured so as to hold a substrate and rotatable about the second rotational axis line, wherein the substrate holding members of the left and right arms are arranged at the same height as each other, wherein the second rotational axis line is positioned inward in a left and right direction with respect to the first rotational axis line, wherein the arm drive unit has a first drive portion for rotating the first link member about the pivot axis line, a turning pulley rotatable about the pivot axis line independently from the first link member, a first pulley rotatable integrally with the second link member about the first rotational axis line, a belt connecting the turning pulley with the first pulley, a second pulley arranged according to the first rotational axis line and fixed to the first link member, a third pulley rotatable integrally with the substrate holding portion about the second rotational axis line, and a belt connecting the second pulley with the third pulley, and wherein a pulley ratio between the turning pulley, the first pulley, the second pulley, and the third pulley is set so that a moving locus of the substrate holding member when the first link member is rotated about the pivot axis line by the first drive portion so as to extend and contract the arm in a state that the turning pulley is fixed is substantially linear.

A second aspect of the invention is that, in the first aspect, the pulley ratio is set so that the moving locus of the substrate holding member within an actually applied stroke range of the arm is substantially linear.

A third aspect of the invention is that, in the second aspect, the pulley ratio is set so that the moving locus of the substrate holding member within a stroke range in a front region of the actually applied stroke range of the arm is substantially linear.

A fourth aspect of the invention is that, in any one of the first to third aspects, the control unit has a function of rotating the second link member about the first rotational axis line and also rotating the substrate holding member about the second rotational axis line by rotating the turning pulley so as to adjust a position of the substrate holding member.

In order to achieve the above-mentioned objects, a substrate conveying robot according to a fifth aspect of the present invention comprises left and right arms having a common pivot axis line, an arm drive unit for driving the left and right arms, and a control unit for controlling the arm drive unit, wherein each of the left and right arms has a first link member having the pivot axis line in a base end portion and having a first rotational axis line on a tip end portion, a second link portion having the first rotational axis line in a base end portion and having a second rotational axis line on a tip end portion, and a substrate holding member configured so as to hold a substrate and rotatable about the second rotational axis line, wherein the substrate holding members of the left and right arms are arranged at the same height as each other, wherein the second rotational axis line is positioned inward in a left and right direction with respect to the first rotational axis line, wherein the arm drive unit has a first drive portion for rotating the first link member about the pivot axis line, a turning pulley rotatable about the pivot axis line independently from the first link member, a first pulley rotatable integrally with the second link member about the first rotational axis line, a belt connecting the turning pulley with the first pulley, a second pulley arranged according to the first rotational axis line and fixed to the first link member, a third pulley rotatable integrally with the substrate holding portion about the second rotational axis line, and a belt connecting the second pulley with the third pulley, and wherein the control unit has a function of rotating the second link member about the first rotational axis line and also rotating the substrate holding member about the second rotational axis line by rotating the turning pulley so as to adjust a position of the substrate holding member.

A sixth aspect of the invention is that, in any one of the first to fifth aspects, two pairs of the left and right arms are vertically provided.

A seventh aspect of the invention is that, in the sixth aspect, the turning pulley of any one of the upper left and right arms and the turning pulley of any one of the lower left and right arms are connected so as to rotate integrally with each other.

An eighth aspect of the invention is that, in the seventh aspect, the turning pulley of the arm on an upper left side and the turning pulley of the arm on a lower right side are connected and also the turning pulley of the arm on an upper right side and the turning pulley of the arm on a lower left side are connected.

A ninth aspect of the invention is that, in any one of the first to eighth aspects, the second rotational axis line moves from a front side to a rear side across a position of the pivot axis line when a state of the left and right arms is changed from an arm extended state that a turning radius when the arm is rotated about the pivot axis line becomes maximum to an arm contracted state that the turning radius becomes minimum.

A tenth aspect of the invention is that, in any one of the first to ninth aspects, the arm drive unit is configured so as to drive each of the left and right arms independently.

An eleventh aspect of the invention is that, in any one of the first to tenth aspects, the control unit has a function of rotating the turning pulley and the first link member at the same time or at different timings in an extension-contraction operation of the arm.

A twelfth aspect of the invention is that, in any one of the first to eleventh aspects, an elevating drive unit for elevating the arm along the pivot axis line is further provided.

A thirteenth aspect of the invention is that, in any one of the first to twelfth aspects, the belt is a steel belt.

In order to achieve the above-mentioned objects, a fourteenth aspect of the invention is a method for operating a substrate conveying robot comprising left and right arms having a common pivot axis line and an arm drive unit for driving the left and right arms, wherein each of the left and right arms has a first link member having the pivot axis line in a base end portion and having a first rotational axis line on a tip end portion, a second link portion having the first rotational axis line in a base end portion and having a second rotational axis line on a tip end portion, and a substrate holding member configured so as to hold a substrate and rotatable about the second rotational axis line, wherein the substrate holding members of the left and right arms are arranged at the same height as each other, wherein the second rotational axis line is positioned inward in a left and right direction with respect to the first rotational axis line, wherein the arm drive unit has a first drive portion for rotating the first link member about the pivot axis line, a turning pulley rotatable about the pivot axis line independently from the first link member, a first pulley rotatable integrally with the second link member about the first rotational axis line, a belt connecting the turning pulley with the first pulley, a second pulley arranged according to the first rotational axis line and fixed to the first link member, a third pulley rotatable integrally with the substrate holding portion about the second rotational axis line, and a belt connecting the second pulley with the third pulley, and wherein the second link member is rotated about the first rotational axis line and also the substrate holding member is rotated about the second rotational axis line by rotating the turning pulley so as to adjust a position of the substrate holding member.

A fifteenth aspect of the invention is that, in the fourteenth aspect, the substrate conveying robot comprises two pairs of the left and right arms vertically, wherein the turning pulley of any one of the upper left and right arms and the turning pulley of any one of the lower left and right arms are connected so as to rotate integrally with each other.

A sixteenth aspect of the invention is that, in the fifteenth aspect, the turning pulley of the arm on an upper left side and the turning pulley of the arm on a lower right side are connected and also the turning pulley of the arm on an upper right side and the turning pulley of the arm on a lower left side are connected.

A seventeenth aspect of the invention is that, in any one of the fourteenth to sixteenth aspects, each of the left and right arms is driven independently.

A eighteenth aspect of the invention is that, in any one of the fourteenth to seventeenth aspects, the turning pulley and the first link member are rotated at the same time or at different timings in an extension-contraction operation of the arm.

Effect of the Invention

According to the invention, in a substrate conveying robot comprising left and right arms with a common pivot axis line and having left and right substrate holding members arranged at the same height, a moving locus of a substrate conveying member in an arm extension-contraction operation can be substantially linear.

According to the present invention, in a substrate conveying robot comprising left and right arms with a common pivot axis line and having left and right substrate holding members arranged at the same height, a position of the substrate holding member can foe adjusted with sufficiently high flexibility in the front-back direction (X direction) and the left and right direction (Y direction).

EMBODIMENT OF THE INVENTION

Hereunder, a substrate conveying robot and a method for operating the same according to an embodiment of the present invention will be described referring to the figures.

As illustrated in FIGS. 1 to 4, the substrate conveying robot 1 according to the embodiment comprises upper left and right arms 2La, 2Ra with a common pivot axis line L0 and lower left and right arms 2Lb, 2Rb with a common pivot axis line L0. The common pivot axis line L0 of the upper left and right arms 2La, 2Ra and the common pivot axis line L0 of the lower left and right arms 2Lb, 2Rb are the same.

Figure 1:
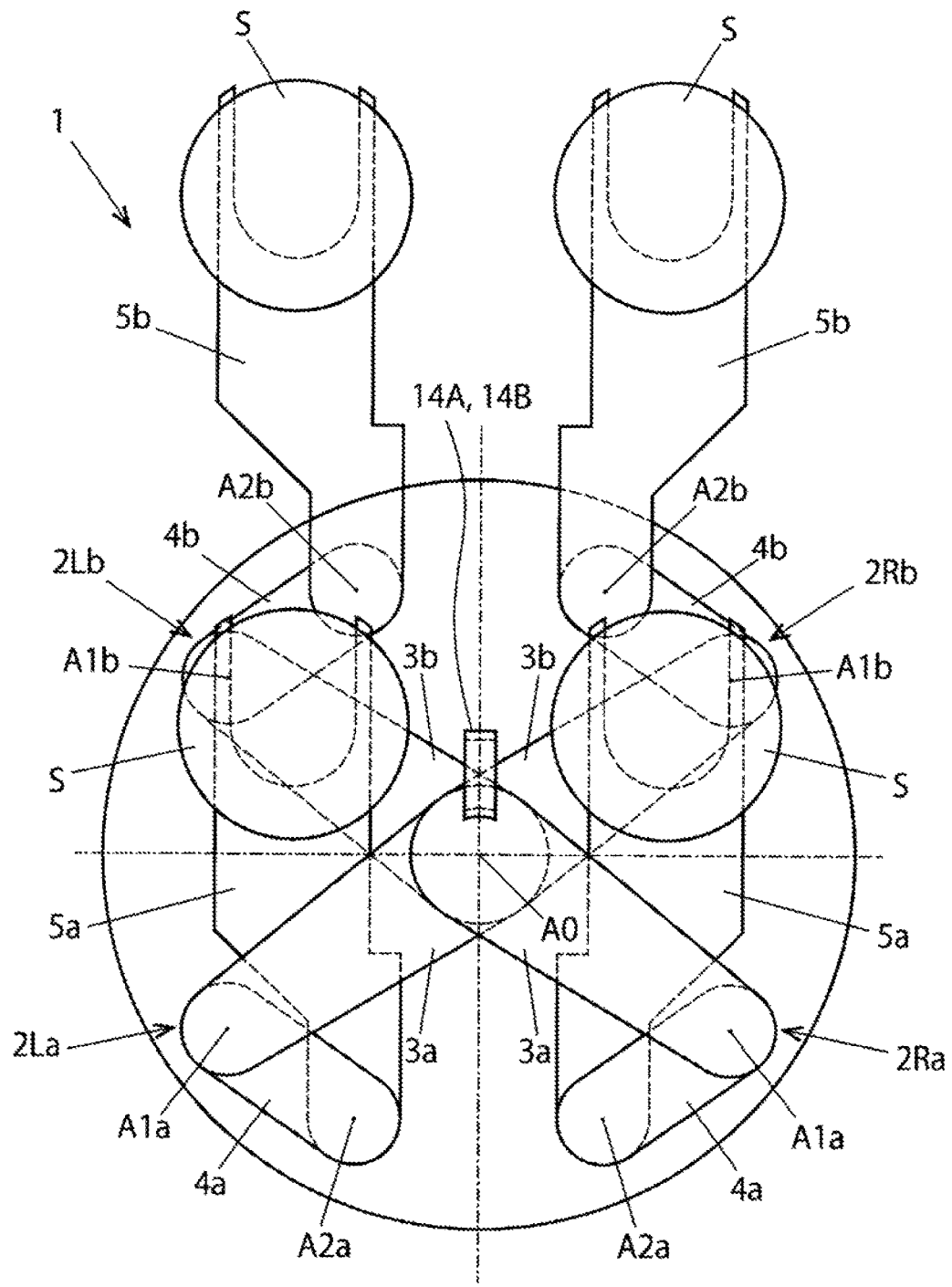
FIG. 1 is a plan view schematically illustrating a substrate conveying robot according to an embodiment of the present invention.
Figure 2:
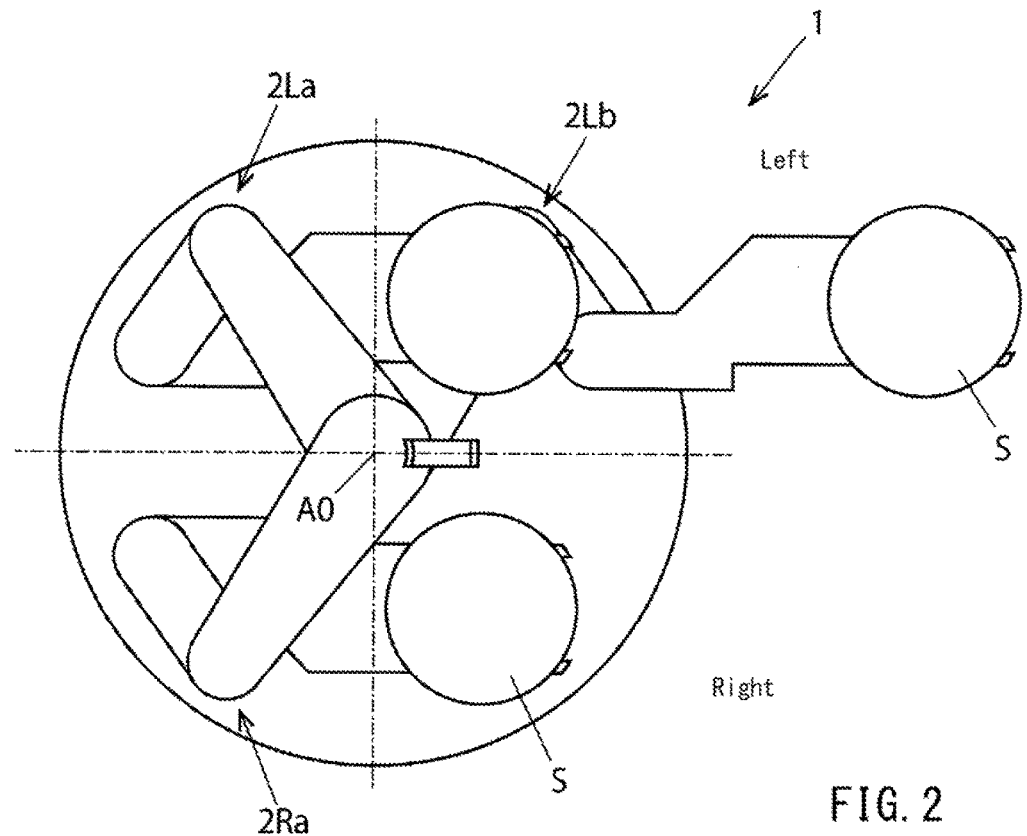
FIG. 2 is another plan view schematically illustrating the substrate conveying robot in FIG. 1.

In FIG. 1, the upper left and right arms 2La, 2Ra are in an arm contracted state and the lower left and right arms 2Lb, 2Rb are in an arm extended state. Here, the arm contracted state is a state that a turning radius when an arm is rotated about the pivot axis line L0 becomes minimum and the arm extended state is a state that a turning radius when the arm is rotated about the pivot axis line L0 becomes maximum.

The upper left and right arms 2La, 2Ra and the lower left and right arms 2Lb, 2Rb overlap with each other in a view from the vertical direction in the arm contracted state, and the both have a common minimum turning radius. Also, the upper left and right arms 2La, 2Ra and the lower left and right arms 2Lb, 2Rb overlap with each other in a view from the vertical direction also in the arm extended state, and the both have a common maximum reach.

As illustrated in FIG. 1, each of the upper left and right arms 2La, 2Ra comprise a hollow first link member 3a, a hollow second link member 4a, and a substrate holding member (hand) 5a.

The first link member 3a has a pivot axis line A0 in the base end portion thereof and has a first rotational axis line A1a in the tip end portion thereof, and it can be rotated about the pivot axis line A0. The second link member 4a has a first rotational axis line A1a in the base end portion thereof and has a second rotational axis line A2a in the tip end portion thereof, and it can be rotated about the first rotational axis line A1a. The second rotational axis line A2a in the tip end portion of the second link member 4a is positioned on the inner side in the left and right direction than the first rotational axis line A1a in the tip end portion of the first link member 3a.

Similarly, each of the lower left and right arms 2Lb, 2Rb comprise a hollow first link member 3b, a hollow second link member 4b, and a substrate holding member (hand) 5b.

The first link member 3b has a pivot axis line A0 in the base end portion thereof and has a first rotational axis line A1b in the tip end portion thereof, and it can be rotated about the pivot axis line A0. The second link member 4b has a first rotational axis line A1b in the base end portion thereof and has a second rotational axis line A2b in the tip end portion thereof, and it can be rotated about the first rotational axis line A1b. The second rotational axis line A2b in the tip end portion of the second link member 4b is positioned on the inner side in the left and right direction than the first rotational axis line A1b in the tip end portion of the first link member 3b.

Substrate holding members 5a, 5b are configured so as to hold a substrate S such as a semiconductor wafer, having the second rotational axis lines A2a, A2b in the base end portions thereof and they can be rotated about the second rotational axis lines A2a, A2b.

Figure 3:
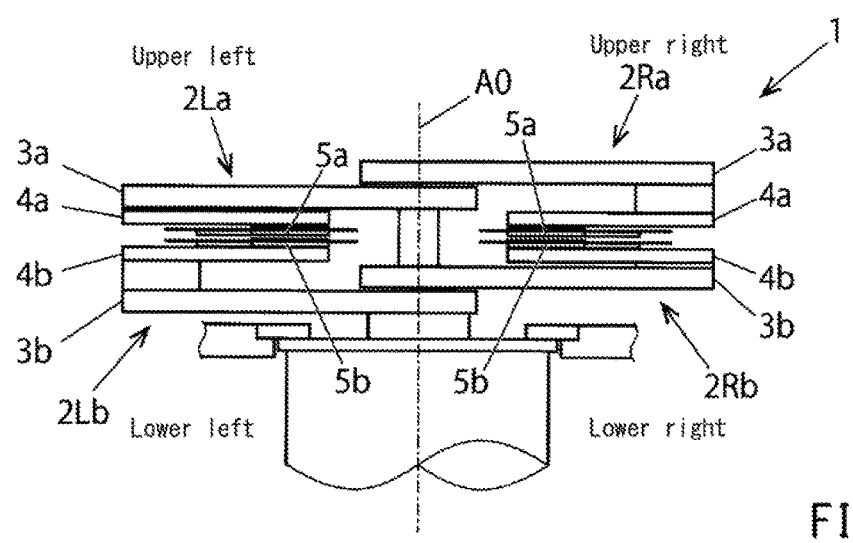
FIG. 3 is a back view schematically illustrating the substrate conveying robot in FIG. 1.
Figure 4:
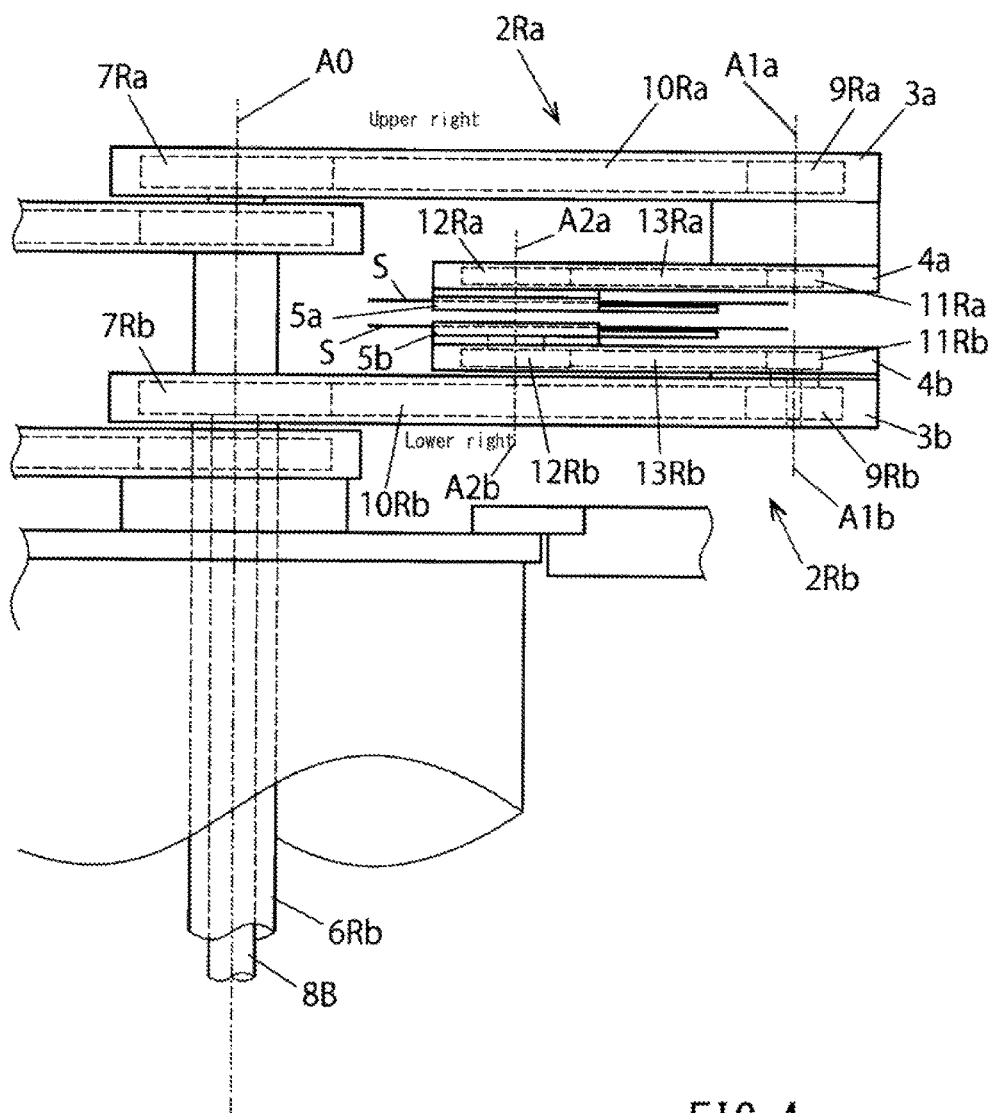
FIG. 4 is a longitudinal section view illustrating an arm drive unit of the substrate conveying robot in FIG. 1.

As illustrated in FIGS. 3 and 4, members configuring the upper right arm 2Ra are the hollow first link member 3a, the hollow second link member 4a, and the substrate holding member (hand) 5a in order from the top. The upper left am 2La is also configured in the same manner.

Also, members configuring the lower right arm 2Ra are the hollow first link member 3b, the hollow second link member 4b, and the substrate holding member (hand) 5b in order from the bottom. The lower left arm 2Lb is also configured in the same manner.

As illustrated in FIG. 4, an upper end of an arm drive shaft (first drive portion) 6Rb for rotating the first link member 3b about the pivot axis line A0 is fixed to a lower surface of the base end portion of the first link member 3b of the lower right arm 2Rb. A turning pulley 7Rb rotatable about the pivot axis A0 independently from the first link member 3b is provided inside the base end portion of the first link member 3b. An upper end of a pulley drive shaft 8B for rotating the turning pulley 7Rb about the pivot axis A0 is fixed to the center of a lower surface of the turning pulley 7Rb.

A cylindrical pulley drive shaft 8B is inserted through the inside of the cylindrical arm drive shaft 6Rb, and the arm drive shaft 9Rb and the pulley drive shaft 8B are arranged concentrically, centered on the pivot axis line A0.

A first pulley 9Rb rotatable about the first rotational axis line A1b independently from the first link member 3b is provided inside the tip end portion of the first link member 3b. An upper surface of the first pulley 9Rb is connected to a lower surface of a base end portion of the second link member 4b via a connecting shaft. The first pulley 9Rb is rotated integrally with the second link member 4b about the first rotational axis line A1b.

The turning pulley 7Rb and the first pulley 9Rb are connected by a first belt 7Rb and the both pulleys 7Rb, 9Rb are rotated integrally with each other via the first belt 10Rb. The first belt 10Rb is preferably a steel belt. By using a steel belt, generation of particles can be suppressed, and also generation of outgas can be suppressed. Therefore, it is suitable to be used in an environment with a high cleanness or a vacuum region such as a processing chamber of a semiconductor manufacturing device.

Note that, a belt which can be used in the substrate conveying robot according to the present invention is not limited to a steel belt, and a rubber timing belt, for example, can also be used.

A second pulley 11Rb rotatable about the first rotational axis line A1b independently from the second link member 4b is provided inside the base end portion of the second link member 4b. A lower surface of the second pulley 11Rb is fixed to the first link member 3b via a connecting shaft. The connecting shaft of the second pulley 11Rb is inserted through the inside of the cylindrical connecting shaft of the first pulley 9Rb, and the first pulley 9Rb and the second pulley 11Rb are arranged concentrically, centered on the first rotational axis line A1b.

A third pulley 12Rb rotatable about the second rotational axis line A2b independently from the second link member 4b is provided inside the tip end portion of the second link member 4b. An upper surface of the third pulley 12Rb is connected to a lower surface of a base end portion of the substrate holding member 5b via a connecting shaft. The third pulley 12Rb is rotated integrally with the substrate holding member 5b about the second rotational axis line A2b.

The second pulley 11Rb and the third pulley 12Rb are connected by a second belt 13Rb and the both pulleys 11Rb, 12Rb are rotated integrally with each other via the second belt 13Rb. The second belt 13Rb is preferably a steel belt. As described above, by using a steel belt, generation of particles can be suppressed.

The above-described arm drive shaft 6Rb, pulley drive shaft 8b, turning pulley 7Rb, first pulley 9Rb, second pulley 11Rb, third pulley 12Rb, first belt 10Rb, and second belt 13Rb configure the arm drive unit of the lower right arm 2Rb. Although the configurations of the lower right arm 2Rb and its arm drive unit are described as above, as illustrated in FIG. 4, the configurations of the upper right arm 2Ra and its arm drive unit are basically configured so that the configurations of the lower right arm 2Rb and its arm drive unit are inverted vertically with respect to the parts other than the arm drive shaft and pulley drive shaft.

The upper right arm 2Ra and its drive unit comprises a turning pulley 7Ra, a first pulley 9Ra, a first belt 10Ra, a second pulley 11Ra, a third pulley 12Ra, and a second belt 13Ra as well as the above-described lower right arm 2Rb as the inner configuration.

Also, the configurations of the lower left arm 2Lb and its arm drive unit are basically configured so that the lower right arm 2Rb and its drive unit are horizontally inverted. Also, the configurations of the upper left arm 2La and its arm drive unit are basically configured so that the configuration of the upper right arm 2Ra is horizontally inverted.

As illustrated in FIG. 3, the substrate holding members 5b of the lower left and right arms 2LB, 2Rb are arranged at the same height to each other, and also the substrate holding members 5a of the upper left and right arms 2La, 2Ra are arranged at the same height to each other.

Each arm drive unit of the upper left and right arms 2La, 2Ra is configured so as to drive each of the left and right arms 2La, 2Ra independently. Similarly, each arm drive unit of the lower left and right arms 2Lb, 2Rb is configured so as to drive each of the left and right arms 2Lb, 2Rb independently.

Figure 5:
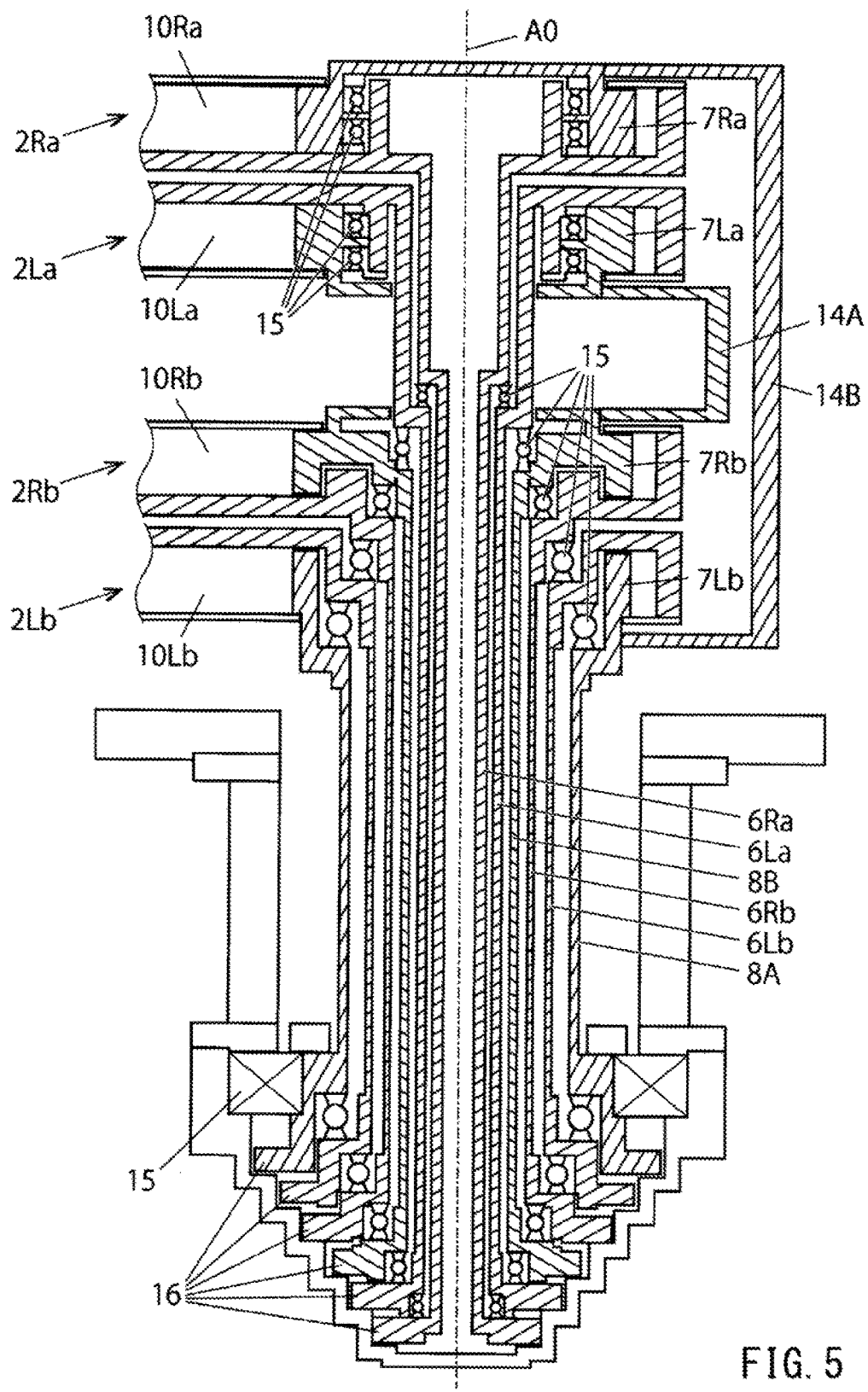
FIG. 5 is another longitudinal section view illustrating the arm drive unit of the substrate conveying robot in FIG. 1.

As illustrated in FIG. 5, in the arm drive unit of the substrate conveying robot 1, four aria drive shafts 6La, 6Ra, 6Lb, 6Rb and two pulley drive shafts 8A, 8B are arranged concentrically about the pivot axis line A0.

The arm drive shaft 6Ra of the upper right arm 2Ra is arranged on the innermost side, and the arm drive shaft 6La of the upper left arm 2La is arrange on the outside thereof.

The pulley drive shaft 8B of the lower right arm 2Rb is arranged on the outside of the arm drive shaft 6La of the upper left arm 2La. The turning pulley 7Rb of the lower right arm 2Rb and the turning pulley 7La of the upper left arm 2La are connected by a pulley connecting member 14A and the both pulleys 7Rb, 7La are integrally rotated. Therefore, the both pulleys 7Rb, 7La can be rotated by a single drive source at the same time.

The arm drive shaft 6Rb of the lower right arm 2Rb is arranged on the outside of the pulley drive shaft 8B, and the arm drive shaft 6Lb of the lower left arm 2Lb is arranged on the outside thereof.

The pulley drive shaft 8A of the lower left arm 2Lb is arranged on the outside of the arm drive shaft 6Lb of the lower left aria 2Lb. The turning pulley 7Lb of the lower left arm 2Lb and the turning pulley 7Ra of the upper right arm 2Ra are connected by a pulley connecting member 14B and the both pulleys 7Lb, 7Ra are integrally rotated. Therefore, the both pulleys 7Lb, 7Ra can be rotated by a single drive source at the same time.

Note that an array of the arm drive shafts 6La, 6Ra, 6Lb, 6Rb and the pulley drive shafts 8A, 8B is not limited to the array in FIG. 5, and various arrays can be employed.

First belts 10La, 10Ra are mounted on the turning pulleys 7La, 7Ra of the upper left and right arms 2La, 2Ra, respectively. First belts 10Lb, 10Rb are mounted on the turning pulleys 7Lb, 7Rb of the lower left and right arms 2Lb, 2Rb, respectively.

Each of the arm drive shafts 6La, 6Ra, 6Lb, 6Rb and each of the pulley drive shafts 8A, 8B are rotatably supported by each bearing member 15, respectively. Each power transmitting portion 16 is formed at each lower end portion of each of the arm drive shafts 6La, 6Ra, 6Lb, 6Rb and each of the pulley drive shafts 8A, 8B. Fewer from each servo motor (not illustrated) is transmitted to each power transmitting portion 16, thereby each of the arm drive shafts 6La, 6Ra, 6Lb, 6Rb and each of the pulley drive shafts 8A, 8B being rotatably driven independently.

Figure 6:
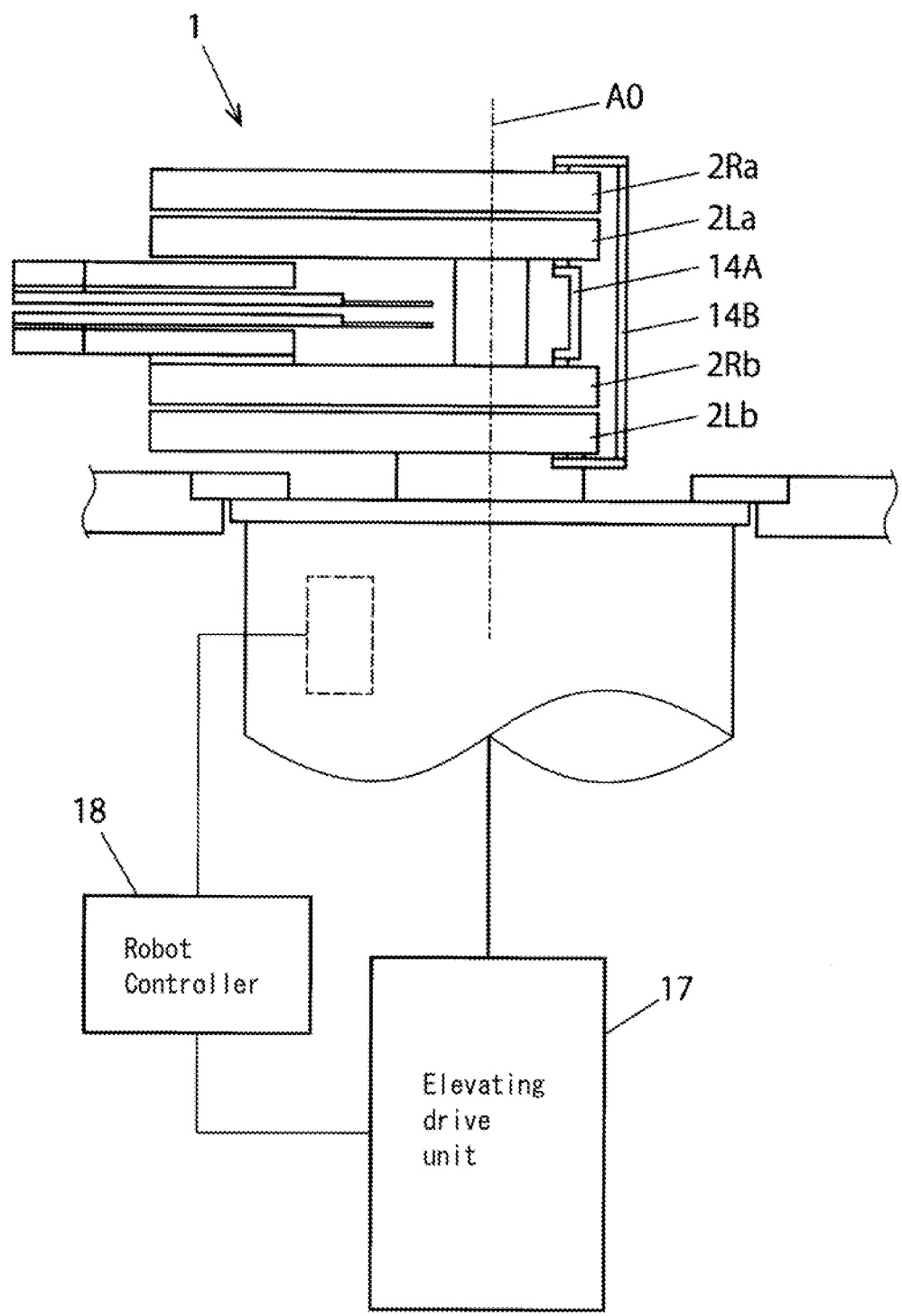
FIG. 6 is a side view illustrating the arm drive unit of the substrate conveying robot in FIG. 1.

As illustrated in FIG. 6, the substrate conveying robot 1 according to the embodiment comprises an elevating drive unit 17 for elevating the upper and lower left and right arms 2La, 2Ra, 2Lb, 2Rb as a whole along the pivot axis line A0. The elevating drive unit 17 preferably has a servo motor as a drive source. A drive source for each arm drive unit of the upper and lower left and right arms 2La, 2Ra, 2Lb, 2Rb and a drive source for the elevating drive unit are controlled by a robot controller (control unit) 18.

Figure 7:
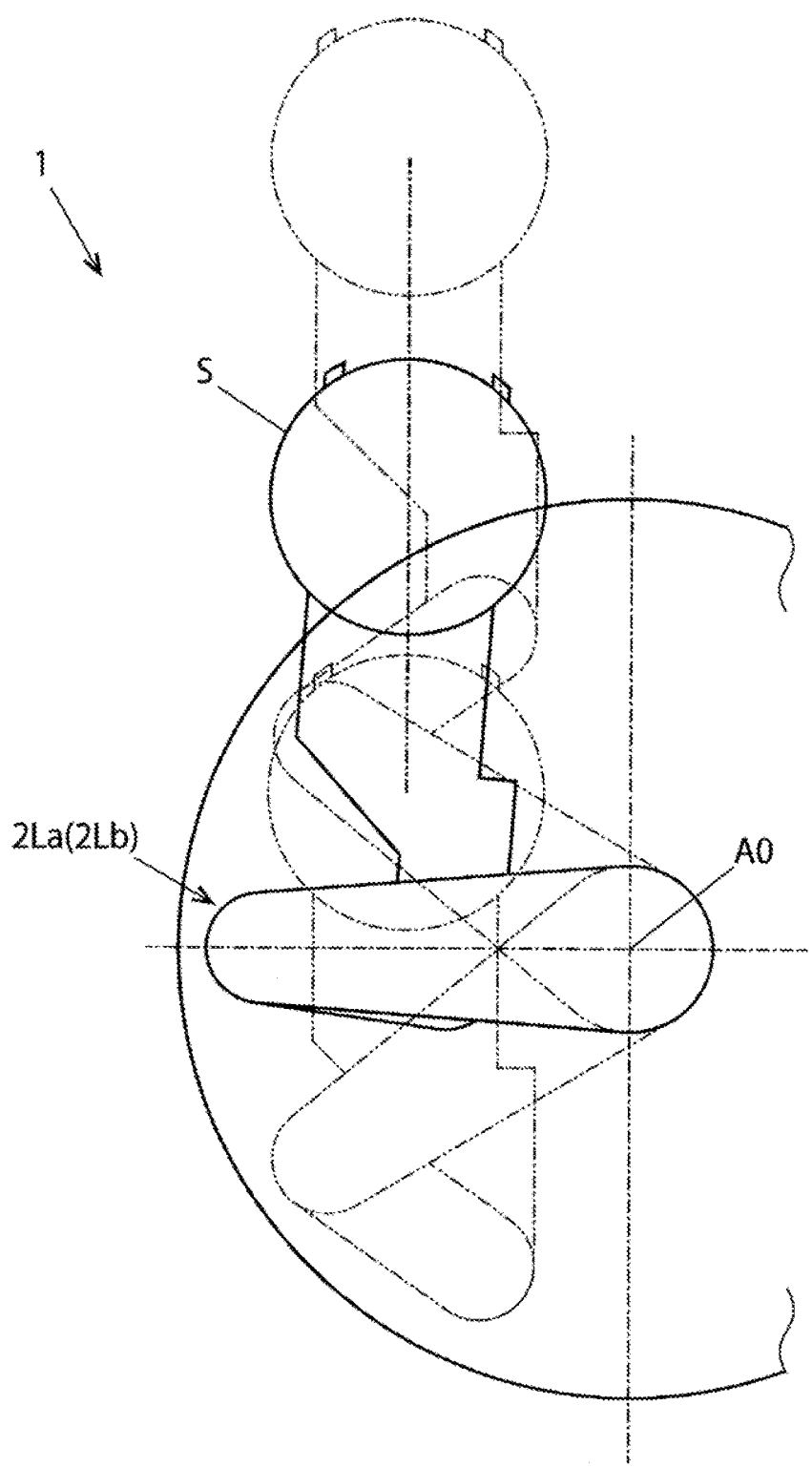
FIG. 7 is a plan view illustrating an arm extension-contraction operation of the substrate conveying robot in FIG. 1.

In the substrate conveying robot 1 according to the embodiment, when the arm drive shafts 6La, 6Ra, 6Lb, 6Rb are turned so as to rotate the first link members 3a, 3b about the pivot axis line A0 in a state that the turning pulleys 7La, 7Ra, 7Lb, 7Rb are fixed by fixing the pulley drive shafts 8A, 8B, power is transmitted to the second link members 4a, 4b and the substrate holding members 5a, 5b by the power transmitting mechanism configured by the pulleys and the belts, thereby the extension-contraction operation of the arms 2La, 2Ra, 2Lb, 2Rb being performed as illustrated in FIG. 7.

As described above, by rotating the first link members 3a, 3b in the state that the turning pulleys 7La, 7Ra, 7Lb, 7Rb are fixed, the attitudes of the substrate holding members 5a, 5b are maintained constant in the arm extension-contraction operation. Therefore, interference with a surrounding construction or the like when conveying a substrate or interference with an inner wall surface of a substrate storing portion when a substrate is inserted into the substrate storing portion (FOUP, substrate mounting shelf or the like in a load lock chamber) can be surely prevented.

Note that, in the substrate conveying robot 1 according to the embodiment, when the upper and lower arms 2La, 2Ra, 2Lb, 2Rb are turned about the pivot axis line A0 as a whole, the arm drive shafts 6La, 6Ra, 6Lb, 6Rb and the pulley drive shafts 8a, 8b are rotated simultaneously at the same rotational speed.

In the substrate conveying robot 1 according to the embodiment, the second rotational axis lines A2a, A2b are configured to move from the front side to the rear side across the position of the pivot axis line A0 when the state of the left and right arms 2La, 2Ra, 2Lb, 2Rb is changed from the arm extended state that a turning radius when the arms 2La, 2Ra, 2Lb, 2Rb are rotated about the pivot axis line A0 is maximum to the arm contracted state that the turning radius is minimum.

Therefore, it is possible to pull the substrate conveying members 5a, 5b to the rear side largely, and a desired minimum turning radius can be ensured even when the substrate conveying members 5a, 5b which have relatively large dimensions in the back and force direction as illustrated in FIG. 1 are used.

Next, in the substrate conveying robot 1 according to the embodiment, a pulley ratio between the turning pulleys 7La, 7Ra, 7Lb, 7Rb, the first pulleys 9Ra, 9Rb, the second pulleys 11Ra, 11Rb, and the third pulleys 12Ra, 12Rb is set so that a moving locus of the substrate holding members 5a, 5b when the arms 2La, 2Ra, 2Lb, 2Rb are extended and contracted by rotating the first link members 3a, 3b about the pivot axis line A0 by the arm drive shafts (first drive portion) 6La, 6Ra, 6Lb, 6Rb in a state that the turning pulleys 7La, 7Ra, 7Lb, 7Rb are fixed is substantially linear.

Hereunder, a method for optimizing the pulley ratio in the embodiment will be described. In the embodiment, the pulley ratio between the turning pulleys 7La, 7Ra, 7Lb, 7Rb, the first pulleys 9Ra, 9Rb, the second pulleys 11Ra, 11Rb, and the third pulleys 12Ra, 12Rb is set so that the moving locus of the substrate holding members 5a, 5b within the actually applied stroke range of the arms 2La, 2Ra, 2Lb, 2Rb is substantially linear.

Figure 8:
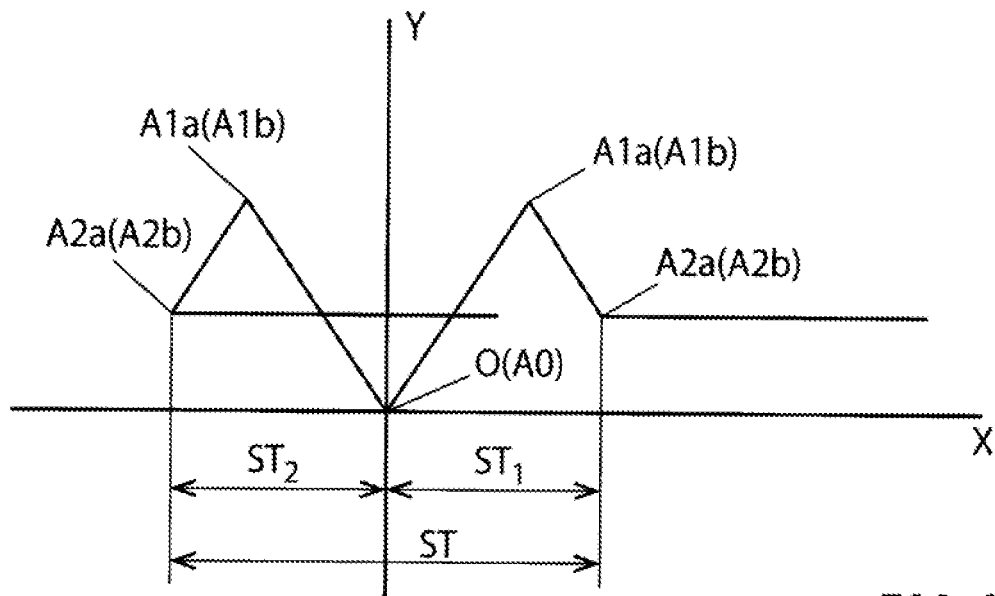
FIG. 8 a view illustrating an optimization method of pulley ratio of the substrate conveying robot in FIG. 1.

First, the actually applied stroke of the arms 2La, 2Ra, 2Lb, 2Rb will be described referring to FIG. 8. In FIG. 8, the origin (O) in the orthogonal coordinate corresponds to the position of the pivot axis line A0, and the X-axis indicates a distance in the back and forth direction from the pivot axis line A0, the Y-axis indicating a distance in the left and right direction from the position of the pivot axis line A0, respectively. Note that, in the embodiment, the attitudes of the substrate holding members 5a, 5b are parallel to the X-axis.

As illustrated in FIG. 8, in the arm contracted state that the turning radius when the arms 2LA, 2Ra, 2Lb, 2Rb are rotated about the pivot axis line A0 is minimum, the second rotational axis lines A2a, A2b of the arms 2La, 2Ra, 2Lb, 2Rb are positioned on the rearmost side in the back and forth direction (the leftmost side in the X-axis direction). In contrast, in the arm extended state that the taming radius when the arms 2La, 2Ra, 2Lb, 2Rb are rotated about the pivot axis line A0 is maximum, the second rotational axis lines A2a, A2b of the arms 2La, 2Ra, 2Lb, 2Rb are positioned on the frontmost side in the back and forth direction (the rightmost side in the X-axis direction).

The actually applied stroke of the arms 2La, 2Ra, 2Lb, 2Rb corresponds to a distance ST in the back and forth direction from the rearmost side positions to the frontmost side positions of the second rotational axis lines A2a, A2b. In the embodiment, of the whole actually applied stroke, a stroke ST1 belonging to an area more forward than the position of the pivot axis line A0 (the origin O of coordinates) and a stroke ST2 belonging to a region more backward than the position of the pivot axis line A0 are identical (ST1=ST2).

In the embodiment, the pulley ratio is optimized so that the moving locus of the substrate holding members 5a, 5b when the arm is extended and contracted is substantially linear within the actually applied stroke range on the basis of the positions of the substrate holding members 5a, 5b in the arm extended state (or in the arm contracted state).

Figure 9:
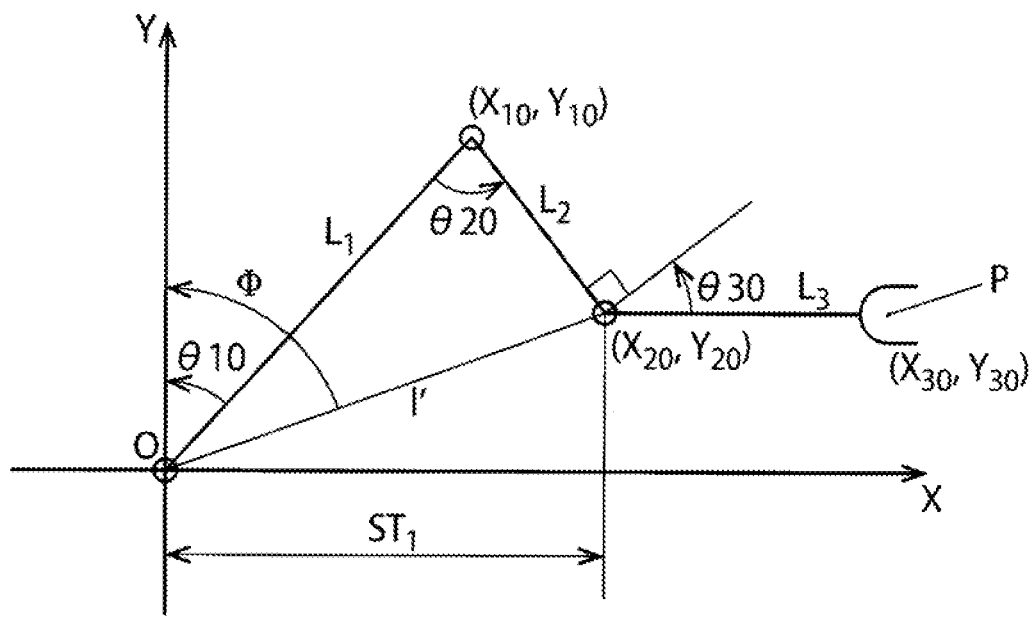
FIG. 9 is another view illustrating the optimization method of pulley ratio of the substrate conveying robot in FIG. 1.

FIG. 9 illustrates various setting parameters regarding the arms 2La, 2Ra, 2Lb, 2Rb in the arm extended state. Meanings of the respective signs are as follows.

O: origin of coordinates (corresponding to position of pivot axis line A0)
P: reference point of substrate holding member
$L_1$: length from first rotational axis line to second rotational axis line
$L_2$: length from second rotational axis line to third rotational axis line
$L_3$: length from third rotational axis line to reference point of substrate holding member
$\theta_{10}$: inner angle defined by line segment of length $L_1$ and Y-axis
$\theta_{20}$: inner angle defined by line segment of length $L_1$ and line segment of length $L_2$
$\theta_{30}$: inner angle defined by line segment of length $L_3$ and line segment orthogonal to length $L_2$
$l'$: length from origin of coordinates to third rotational axis line
$\Phi$: inner angle defined by line segment of length $l'$ and Y-axis
$X_{10}$, $Y_1$: X, Y coordinates of first rotational axis line $X_{20}$, $Y_{20}$: X, Y coordinates of second rotational axis line $X_{30}$, $Y_{30}$: X, Y coordinates of reference point of substrate holding member ST1: part belonging to front region of the whole actually applied stroke Note that a reference point P of the substrate holding members 5a, 5b corresponds to, when a straight line parallel to the X-axis is drawn from the position of the second rotational, axis line ($X_{20}$, $Y_{20}$), the intersection of the straight line and a perpendicular line drawn from the center of a substrate (wafer) S held by the substrate holding members 5a, 5b to the straight line.

Also, with reference to the above-stated setting parameters, the following formula is established when $X_{20}>0$.

$$X_{20}=ST_1$$

$$Y_{20}=L_1-L_2$$

$$\Phi=\tan^{-1}(-X_{20}/Y_{20})$$

$$l'=(X_{20}^2+Y_{20}^2)^{1/2}$$

$$\theta_{10}=\Phi+\cos^{-1}((l'^2+L_1^2-L_2^2)/(2\times l'\times L_1))$$

$$\theta_{20}=\cos^{-1}((L_1^2+L_2^2-l'^2)/(2\times L_1\times L_2))$$

Then, provided that the pulley ratio (diameter ratio of pulley) of the turning pulleys 7La, 7Ra, 7Lb, 7Rb to the first pulleys 9Ra, 9Rb is $K_1$, and the pulley ratio (diameter ratio of pulley) of the second pulleys 11Ra, 11Rb to the third pulleys 12Ra, 12Rb is $K_2$, $$\theta_{20}=-K_1\times\theta_{10}\rightarrow K_1=-\theta_{20}/\theta_{10}$$

is established.

Also, as the attitudes of the substrate holding members 5a, 5b are parallel to the X-axis, $$\theta_{10}+\theta_{20}+\theta_{30}=0\rightarrow\theta_{30}=-\theta_{10}-\theta_{20}$$

Therefore, $$\theta_{30}=-K_2\times\theta_{20}\rightarrow K_2=-\theta_{30}/\theta_{20}$$

is established.

Here, as $$\theta_{30}=-\theta_{10}-\theta_{20}$$

is established as state above, $$K_2=-(-\theta_{10}-\theta_{20})/\theta_{20}=(\theta_{10}+\theta_{20})/\theta_{20}$$

is established.

Figure 10:
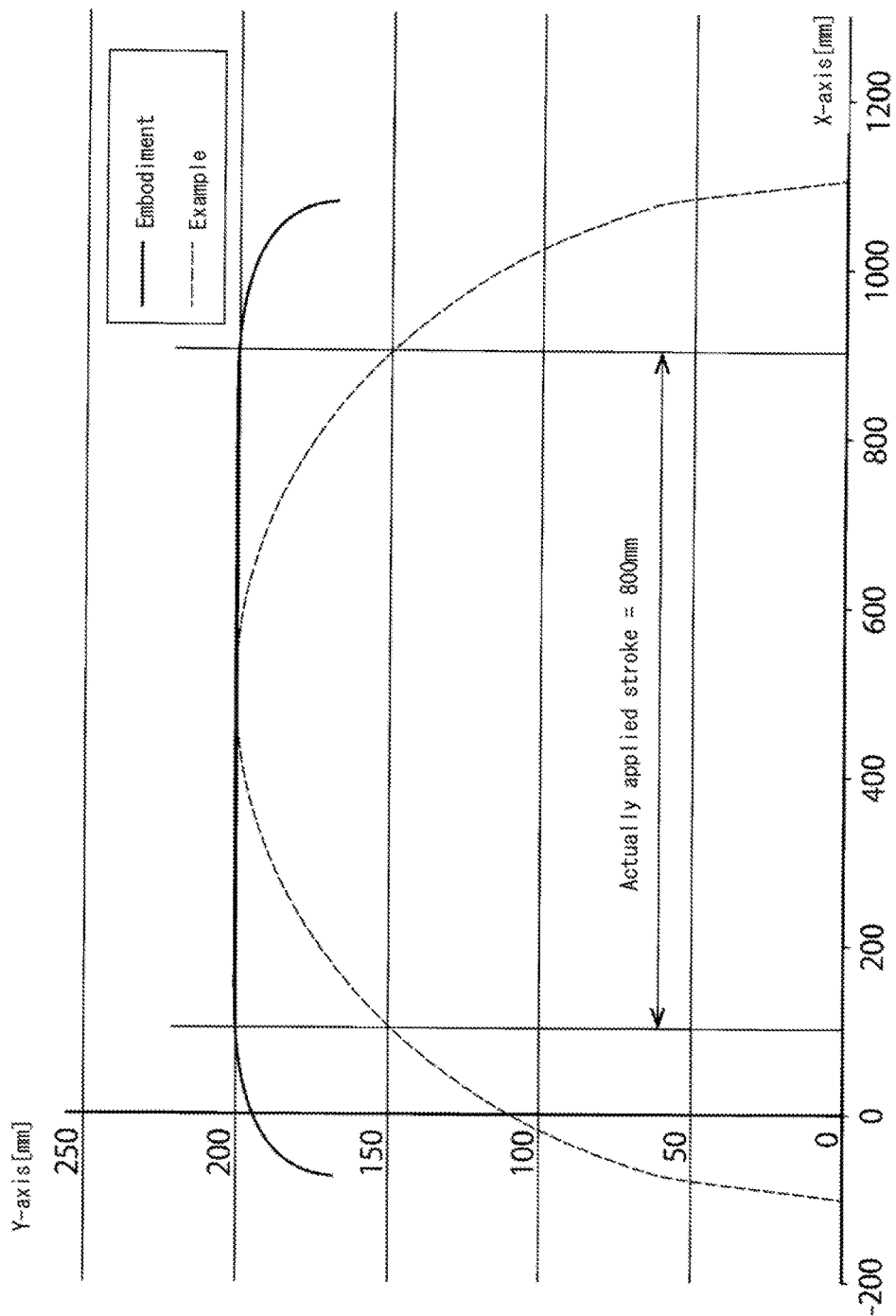
FIG. 10 is another view illustrating the optimization method of pulley ratio of the substrate conveying robot in FIG. 1.

According to the substrate 'conveying' robot 1 according to the embodiment, by optimizing the pulley ratios $K_1$, $K_2$ as described above, the moving locus of the substrate conveying members 5a, 5b in the arm extension/contraction operation can be substantially linear within the range of the actually applied stroke ST, as illustrated in FIG. 10. Note that, in FIG. 10, each right end of a solid line illustrating the embodiment and a broken line illustrating an example corresponds to a case that the first link member and second link member are extended linearly in the front region, and each left end thereof corresponds to a case that the first, link member and second link member of the arm are extended linearly in the rear region in a state that the substrate holding member faces forward.

In an example that the pulley ratio (diameter ratio of pulley) is simply set to 1:2 ($K_1=2$, $K_2=0.5$), the moving locus of the substrate conveying member in the arm extension/contraction operation deviates from a straight line largely so as to be in a curved form, as illustrated by the broken line in FIG. 10. In contrast, as the pulley ratios $K_1$, $K_2$ are optimized as described above in the embodiment, the moving locus of the substrate holding members 5a, 5b in the arm extension/contraction operation can be substantially linear within the actually applied stroke ST of the arms 2La, 2Ra, 2Lb, 2Rb, as illustrated by the solid line in FIG. 1.

Note that, although the stroke ST1 in the front region and the stroke ST2 in the rear region are set to be identical as illustrated in FIG. 8 in the embodiment, the front stroke ST1 and the rear stroke ST2 can be different as an example. When the front stroke ST1 and the rear stroke ST2 are different as mentioned above, either the front stroke ST1 or the rear stroke ST2 is selected as a stroke to be a reference of optimization of the pulley ratio.

As linearity of the moving locus in the front stroke ST1 is usually important when conveying a substrate, it is preferable that the front stroke ST1 is selected so as to perform optimization of the pulley ratio when the front stroke ST1 and the rear stroke ST2 are different.

Figure 11:
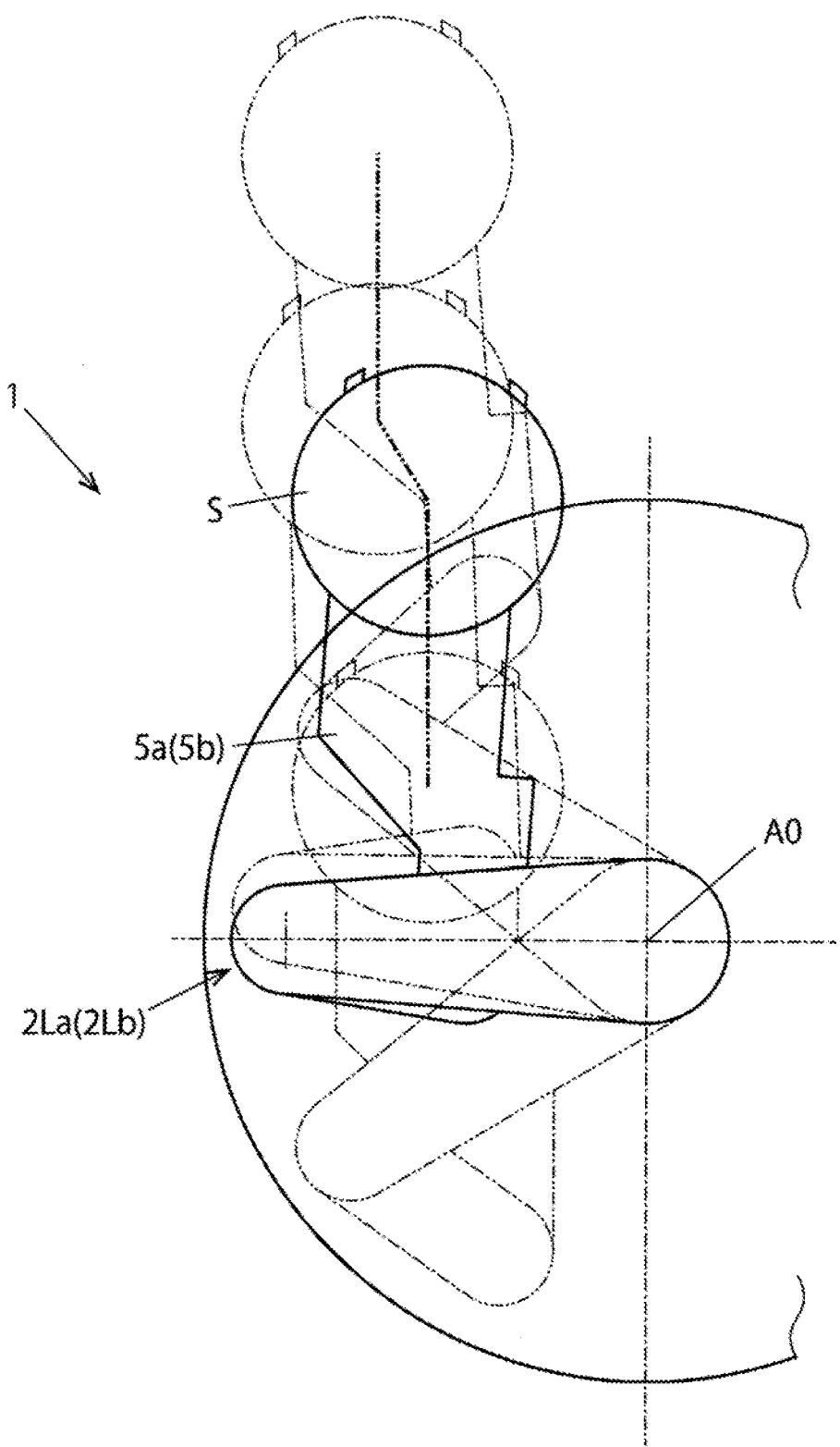
FIG. 11 is a plan view illustrating another method for operating the substrate conveying method in FIG. 1.

As another operation method in the substrate conveying robot 1 according to the embodiment other than the arm extension/contraction operation, the first link members 3a, 3b and the turning pulleys 7La, 7Ra, 7Lb, 7Rb may be rotated at the same timing or at the different timings in the extension/contraction operation of the arms 2La, 2Ra, 2Lb, 2Rb by the robot controller (control unit) 18. For example, the locus of the substrate holding members 5A, 5b can be displaced in the left and right direction as illustrated in FIG. 11 by rotating the turning pulleys 7La, 7Ra, 7Lb, 7Rb in the middle of the arm extension/contraction operation, for example. Such an operation method is effective when an obstacle in the middle of a moving path needs to be avoided, for example.

Next, in the substrate conveying robot 1 according to the embodiment, a method for adjusting positions of the substrate holding members 5a, 5b so as to position them in a target position will be described.

After the first link members 3a, 3b are rotated in the state that the turning pulleys 7La, 7Ra, 7Lb, 7Rb are fixed so as to extend the arms 2La, 2Ra, 2Lb, 2Rb and the move the substrate holding members 5a, 5b to the vicinity of the target position, the turning pulleys 7La, 7Ra, 7Lb, 7Rb are rotated so as to rotate the second link members 4a, 4b about the first rotational axis lines A1a, A1b and also rotate the substrate holding members 5a, 5b about the second rotational axis lines A2a, A2b. Thereby, the positions of the substrate holding members 5a, 5b, namely the position of the substrate S can be adjusted in the back and forth direction (X-direction) and the left and right direction (Y-direction) with sufficiently high flexibility.

Also, the turning pulleys 7La, 7Ra, 7Lb, 7Rb can be rotated before the substrate holding members 5a, 5b reach the vicinity of the target position so as to adjust the positions of the substrate holding members 5a, 5b.

Figure 12:
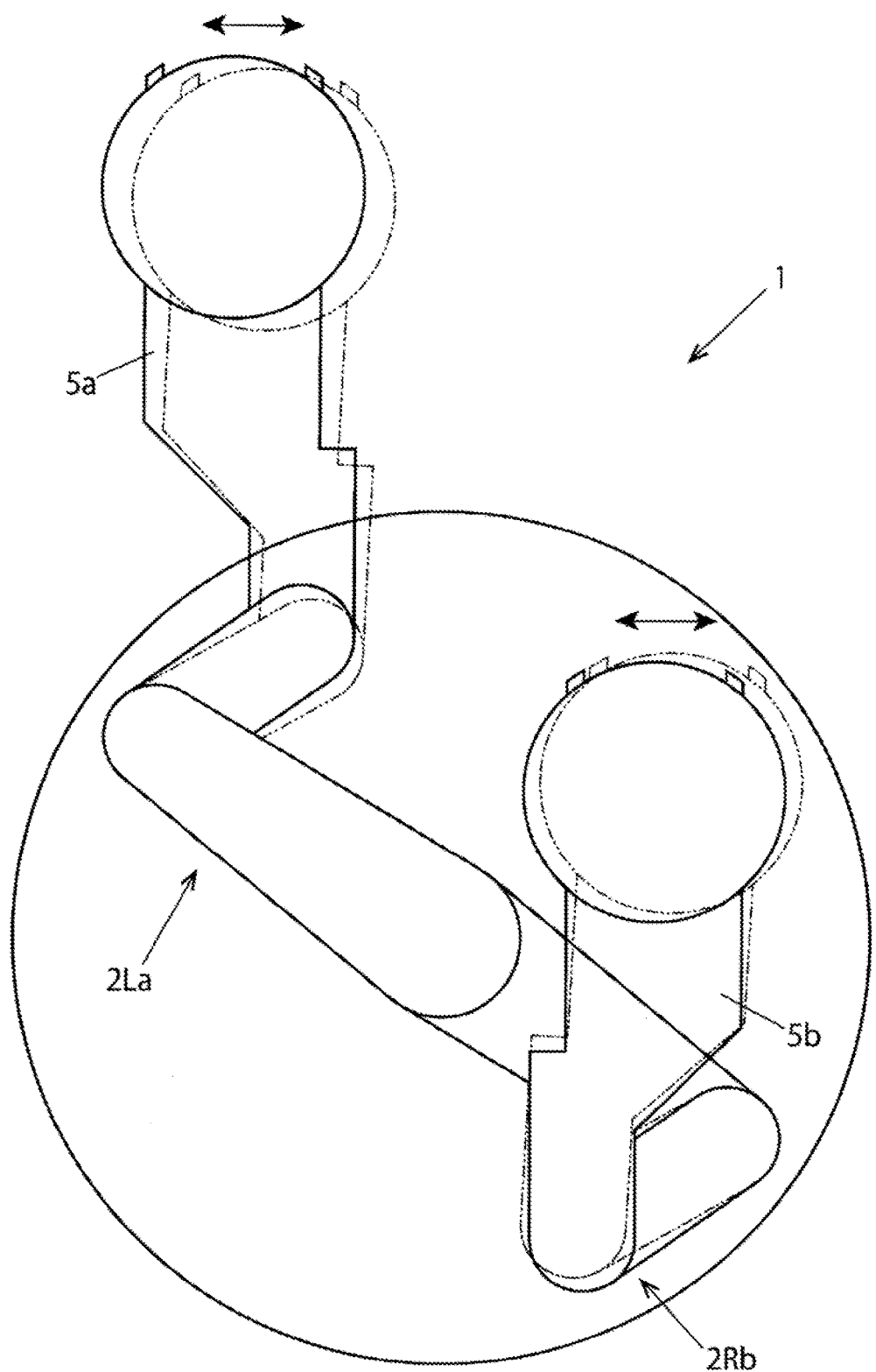
FIG. 12 is a plan view illustrating a position adjusting operation of a substrate holding member in the substrate conveying robot in FIG. 1.

FIG. 12 illustrates a case that the position of the substrate holding member 5a of the upper left arm 2La is adjusted. Then, the substrate holding member 5b of the lower right arm 2Rb also rocks at the same time. However, as the substrate holding member 5b of the lower right arm 2Rb is in the arm contracted state as illustrated in FIG. 12, it is no problem even if it rocks.

For example, when the substrate holding member 5a of the upper left and right arms 2La, 2Ra is used for conveying a substrate S to be processed, and the substrate holding member 5b of the lower left and right arms 2Lb, 2Rb is used for conveying a processed substrate S, it is not necessary to perform positioning of the substrate holding member 5a of the upper arms 2La, 2Ra and positioning of the substrate holding member 5b of the lower arms 2Lb, 2Rb at the same time.

Note that, when there is such a problem that, when a substrate holding member of an arm in a contracted state rocks, it interferes with a surrounding construction or it surpasses the minimum turning radius, the first link member of the arm in the contracted state is rotated according to the rotation of the turning pulley at the same rotational speed. Thereby, the whole arm in the contracted state only rotates about the pivot axis line A0, and rocking operation of the substrate holding member of the arm in the contracted state can be suppressed. Therefore, the substrate holding member can be prevented from interfering with a surrounding construction or surpassing the minimum turning radius.

Also, as the upper and lower two turning pulleys 7La, 7Ra, 7Lb, 7Rb are connected by the pullet connecting members 14A, 14B in the substrate conveying robot 1 according to the embodiment, there is an advantage that the two turning pulleys 7La, 7Rb, 7Lb, 7Rb can be driven by a single drive source and the number of drive sources can be reduced.

Figure 13:
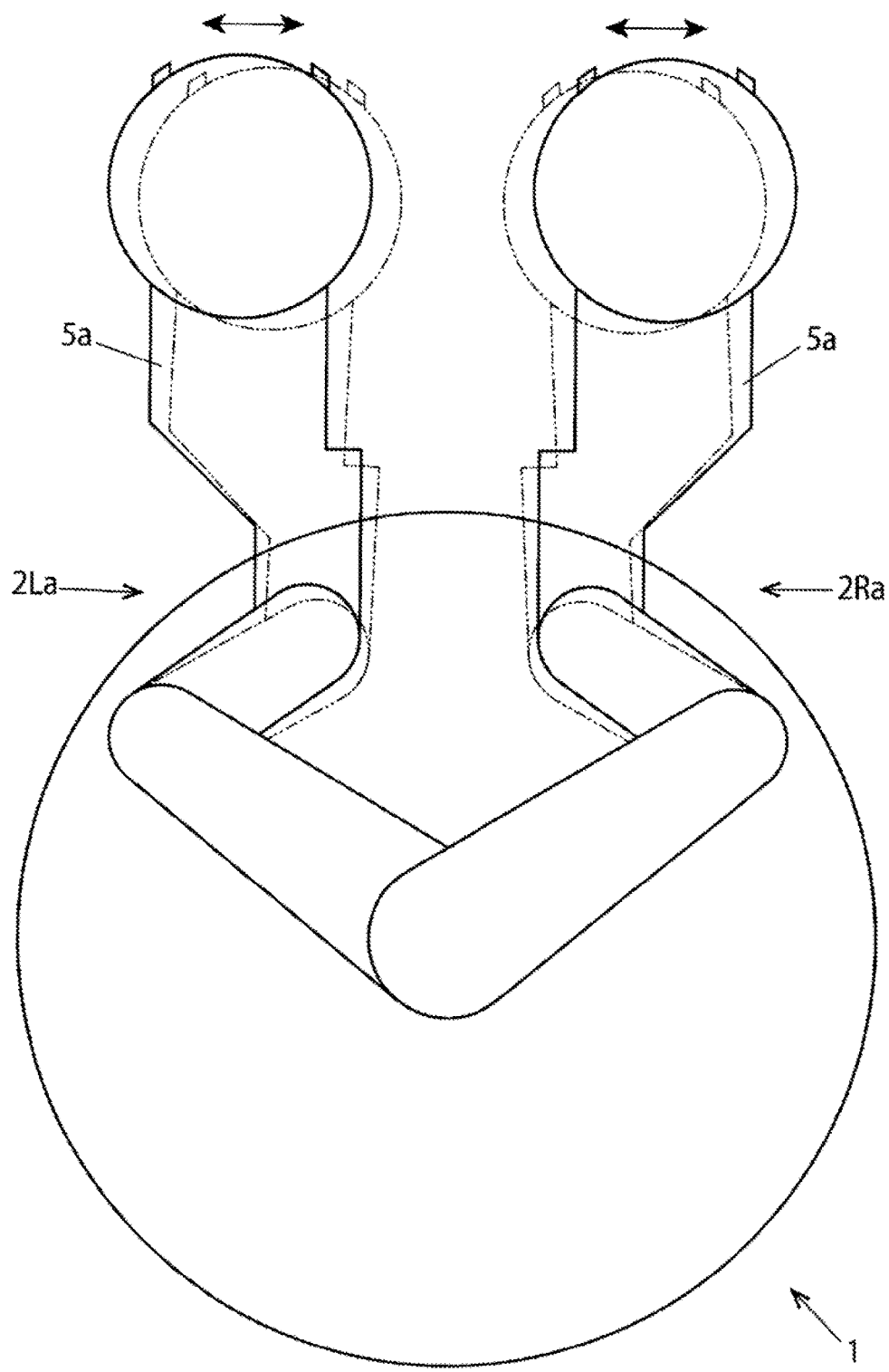
FIG. 13 is another plan view illustrating a position adjusting operation of a substrate holding member in the substrate conveying robot in FIG. 1.

FIG. 13 illustrates a case that the position of each of the substrate holding members 5a of the upper left and right arms 2La, 2Ra is adjusted. As each of turning pulleys 7La, 7Ra of the upper left and arms 2La, 2Ra can be driven mutually independently, the positions of the left and right substrate holding members 5a can be adjusted mutually independently.

As described above, as the pulley ratio is optimized as described above in the substrate conveying robot 1 according to the embodiment, in the substrate conveying robot 1 comprising the left and right arms 2La, 2Ra, 2Lb, 2Rb having the common pivot axis line A0 and having the left and right substrate holding members 5a, 5b arranged at the same height, the moving locus of the substrate conveying members 5a, 5b in the arm extension/contraction operation can be substantially linear within the range of actually applied stroke.

Also, the turning pulleys 7La, 7Ra, 7Lb, 7Rb are rotated so as to adjust the positions of the substrate holding members 5a, 5b, namely the position of the substrate S in the substrate conveying robot 1 according to the embodiment. Therefore, in the substrate conveying robot 1 comprising the left, and right arms 2La, 2Ra, 2Lb, 2Rb having the common pivot axis line A0 and having the left and right substrate holding members 5a, 5b arranged at the same height, the positions of the substrate holding members 5a, 5b can be adjusted in the back and forth direction (X-direction) and the left and right direction (Y-direction) with sufficiently high flexibility.

Also, in the substrate conveying robot 1 according to the embodiment, the turning pulley 7Rb of the lower right arm 2Rb and the turning pulley 7La of the upper left arm 2La are connected by the pulley connecting member 14A and also the turning pulley 7Lb of the lower left arm 2Lb and the turning pulley 7Ra of the upper right arm 2Rb are connected by the pulley connecting member 14B so that the connected two turning pulleys are rotated integrally with each other. Therefore, the necessary number of drive sources for driving the turning pulleys 7La, 7Ra, 7Lb, 7Rb can be reduced to half.

Note that, as a method for connecting the turning pulleys 7La, 7Ra, 7Lb, 7Rb, the turning pulley 7Ra of the upper right arm 2Ra and the turning pulley 7Rb of the lower right arm 2Ra may be connected and also the turning pulley 7La of the upper left arm 2La and the turning pulley 7La of the lower left arm 2Lb may be connected.

Safely, the turning pulleys 7La, 7Ra of any one of the upper left and right arms 2La, 2Ra and the turning pulleys 7La, 7Rb of any one of the lower left and right arms 2Lb, 2Rb may be connected by a pulley connecting member so as to be integrally rotated with each other.

DESCRIPTION OF REFERENCE NUMERALS

1 . . . substrate conveying robot
2La, 2Ra . . . upper left and right arms
2Lb, 2Rb . . . lower left and right arms
3a . . . first link member of upper left and right arms
3b . . . first link member of lower left and right arms
4a . . . second link member of upper left and right arms
4b . . . second link member of lower left and right arms
5a . . . substrate holding member (hand) of upper left and right arms
5b . . . substrate holding member (hand) of lower left and right, arms
6La, 6Ra . . . arm drive shafts (first drive portion) of upper left and right arms
6Lb, 6Rb . . . arm drive shafts (first drive portion) of lower left and right arms
7La, 7Ra . . . turning pulleys of upper left and right arms
7Lb, 7Rb . . . turning pulleys of lower left and right arms
8A, 8B . . . pulley drive shaft
9Ra . . . first pulley of upper right arm
9Rb . . . first pulley of lower right arm
10La, 10Ra . . . first belts of upper left and right arms
10Lb, 10Rb . . . first belts of lower left and right arms
11Ra . . . second pulley of upper right arm
11Rb . . . second pulley of lower right arm
12Ra . . . third pulley of upper right arm
12Rb . . . third pulley of lower right arm
13Ra . . . second belt of upper right arm
13Rb . . . second belt of lower right arm
14A, 14B . . . pulley connecting members
15 . . . bearing member
16 . . . power transmitting portion
17 . . . elevating drive unit
18 . . . robot cord: roller (control unit)
A0 . . . pivot axis line
A1a . . . first rotational axis line of upper left and right arms
A1b . . . first rotational axis line of lower left and right arms
A2a . . . second rotational axis line of upper left and right arms
A2b . . . second rotational axis line of lower left and right arms
S . . . substrate (wafer)

The invention claimed is:

1. A substrate conveying robot comprising:
   left and right arms having a common pivot axis line;
   an arm drive unit for driving the left and right arms; and
   a control unit for controlling the arm drive unit,
   wherein each of the left and right arms has:
      a first link member having the pivot axis line in a base end portion and having a first rotational axis line on a tip end portion;
      a second link member having the first rotational axis line in a base end portion and having a second rotational axis line on a tip end portion; and
      a substrate holding member configured to be capable of holding a substrate and rotatable about the second rotational axis line, wherein the substrate holding members of the left and right arms are arranged at a same height to each other,
wherein the second rotational axis line is positioned inward in a left and right direction with respect to the first rotational axis line,
wherein the arm drive unit has:
  a first drive portion for rotating the first link member about the pivot axis line,
  a turning pulley which is rotatable about the pivot axis line independently from the first link member;
  a first pulley which is rotatable integrally with the second link member about the first rotational axis line;
  a belt connecting the turning pulley with the first pulley;
  a second pulley arranged according to the first rotational axis line and fixed to the first link member;
  a third pulley which is rotatable integrally with the substrate holding member about the second rotational axis line; and
  a belt connecting the second pulley with the third pulley, and
wherein a pulley ratio between the turning pulley, the first pulley, the second pulley, and the third pulley are set so that a moving locus of the substrate holding member when the first link member is rotated about the pivot axis line by the first drive portion so as to extend and contract the arm in a state that the turning pulley is fixed is substantially linear.

2. The substrate conveying robot according to claim 1, wherein the pulley ratio is set so that the moving locus of the substrate holding member within an actually applied stroke range of the arm is substantially linear.

3. The substrate conveying robot according to claim 2, wherein the pulley ratio is set so that the moving locus of the substrate holding member within a stroke range in a front region of the actually applied stroke range of the arm is substantially linear.

4. The substrate conveying robot according to claim 1, wherein the control unit has a function of rotating the second link member about the first rotational axis line and also rotating the substrate holding member about the second rotational axis line by rotating the turning pulley so as to adjust a position of the substrate holding member.

5. The substrate conveying robot comprising:
  left and right arms having a common pivot axis line; an arm drive unit for driving the left and right arms; and
a control unit for controlling the arm drive unit,
wherein each of the left and right arms has:
  a first link member having the pivot axis line in a base end portion and having a first rotational axis line on a tip end portion;
  a second link member having the first rotational axis line in a base end portion and having a second rotational axis line on a tip end portion; and
  a substrate holding member configured to be capable of holding a substrate and rotatable about the second rotational axis line,
wherein the substrate holding members of the left and right arms are arranged at a same height to each other,
wherein the second rotational axis line is positioned inward in a left and right direction with respect to the first rotational axis line,
wherein the arm drive unit has:
a first drive portion for rotating the first link member about the pivot axis line;
  a turning pulley which is rotatable about the pivot axis line independently from the first link member;
  a first pulley which is rotatable integrally with the second link member about the first rotational axis line;
  a belt connecting the turning pulley with the first pulley;
  a second pulley arranged according to the first rotational axis line and fixed to the first link member;
  a third pulley which is rotatable integrally with the substrate holding member about the second rotational axis line; and
  a belt connecting the second pulley with the third pulley, and
wherein the control unit has a function of rotating the second link member about the first rotational axis line and also rotating the substrate holding member about the second rotational axis line by rotating the turning pulley so as to adjust a position of the substrate holding member.

6. The substrate conveying robot according to claim 1 comprising two pairs of the left and right arms vertically.

7. The substrate conveying robot according to claim 6, wherein the turning pulley of any one of upper left and right arms and the turning pulley of any one of lower left and right arms are connected so as to rotate integrally with each other.

8. The substrate conveying robot according to claim 7, wherein the turning pulley of the arm on an upper left side and the turning pulley of the arm on a lower right side are connected and also the turning pulley of the arm on an upper right side and the turning pulley of the arm on a lower left side are connected.

9. The substrate conveying robot according to claim 1, wherein the second rotational axis line moves from a front side to a rear side across a position of the pivot axis line when a state of the left and right arms is changed from an arm extended state that a turning radius when the arm is rotated about the pivot axis line becomes maximum to an arm contracted state that the turning radius becomes minimum.

10. The substrate conveying robot according to claim 1, wherein the arm drive unit is configured so as to drive each of the left and right arms independently.

11. A substrate conveying robot according to claim 1, wherein the control unit has a function of rotating the turning pulley and the first link member at a same time or at different timings in an extension-contraction operation of the arm.

12. A substrate conveying robot according to claim 1 further comprising an elevating drive unit for elevating the arm along the pivot axis line.

13. A substrate conveying robot according to claim 1, wherein the belt is a steel belt.

14. A method of operating a substrate conveying robot comprising left and right arms having a common pivot axis line and an arm drive unit for driving the left and right arms,
  wherein each of the left and right arms has:
    a first link member having the pivot axis line on a base end portion and having a first rotational axis line on a tip end portion;
    a second link member having the first rotational axis line on a base end portion and having a second rotational axis line on a tip end portion; and
    a substrate holding member configured so as to be capable of holding a substrate and rotatable about the second rotational axis line,
  wherein the substrate holding members of the left and right arms are arranged at a same height to each other, wherein the second rotational axis line is positioned inward in a left and right direction with respect to the first rotational axis line, wherein the arm drive unit has:
- a first drive portion for rotating the first link member about the pivot axis line;
- a turning pulley which is rotatable about the pivot axis line independently from the first link member;
- a first pulley which is rotatable integrally with the second link member about the first rotational axis line;
- a belt connecting the turning pulley with the first pulley;
- a second pulley arranged according to the first rotational axis line and fixed to the first link member;
- a third pulley rotatable integrally with the substrate holding member about the second rotational axis line; and
- a belt connecting the second pulley with the third pulley, and wherein the method comprising:
- adjusting a position of the substrate holding member by rotating the second link member about the first rotational axis line, and
- rotating substrate holding member about the second rotational axis line by rotating the turning pulley.

15. The method of operating a substrate conveying robot according to claim 14, wherein the substrate conveying robot comprises two pairs of the left and right arms vertically, and wherein the turning pulley of any one of the upper left and right arms and the turning pulley of any one of the lower left and right arms are connected so as to rotate integrally with each other, the method further comprising the step of operating the substrate conveying robot such that the any one of the lower left and right arms are rotated integrally with each other.

16. The method of operating a substrate conveying robot according to claim 15, wherein the turning pulley of the arm on an upper left side and the turning pulley of the arm on a lower right side are connected and also the turning pulley of the arm on an upper right side and the turning pulley of the arm on a lower left side are connected, the method further comprising the step of operating the substrate conveying robot such that the any one of the lower left and right arms are rotated integrally with each other.

17. The method of operating a substrate conveying robot according to claim 14, further comprising the step of driving independently each of the left and right arms.

18. The method of operating a substrate conveying robot according to claim 14, further comprising the step of extending or contracting the arm by rotating the turning pulley and the first link member at a same time or at different timings.

* * * * *